(12) United States Patent
Feurle

(10) Patent No.: US 6,480,039 B1
(45) Date of Patent: Nov. 12, 2002

(54) INPUT BUFFER OF AN INTEGRATED SEMICONDUCTOR CIRCUIT

(75) Inventor: Robert Feurle, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/662,957

(22) Filed: Sep. 15, 2000

(30) Foreign Application Priority Data

Sep. 15, 1999 (DE) .......................................... 199 44 248

(51) Int. Cl.⁷ .............................................. H03K 5/153
(52) U.S. Cl. ............................. 327/74; 327/68; 327/333
(58) Field of Search ........................... 327/74, 68, 333, 327/437, 379, 280, 264, 272, 274

(56) References Cited

U.S. PATENT DOCUMENTS

| | | | |
|---|---|---|---|
| 4,999,519 A | 3/1991 | Kitsukawa et al. | 326/110 |
| 5,151,622 A | 9/1992 | Thrower et al. | 326/71 |
| 5,223,751 A * | 6/1993 | Simmons et al. | 326/81 |
| 5,440,248 A | 8/1995 | Brown et al. | 326/71 |
| 5,488,322 A * | 1/1996 | Kaplinsky | 327/74 |
| 5,859,526 A * | 1/1999 | Do et al. | 323/280 |
| 6,131,168 A * | 10/2000 | krzyzkowski | 713/503 |
| 6,166,971 A * | 12/2000 | Tamura et al. | 365/198 |
| 6,232,818 B1 * | 5/2001 | Zaliznyak | 327/330 |

FOREIGN PATENT DOCUMENTS

| | | |
|---|---|---|
| DE | 197 22 158 C1 | 11/1998 |
| DE | 198 18 021 A1 | 4/1999 |
| EP | 0 311 088 B1 | 4/1989 |
| JP | 56-079522 | 6/1981 |

* cited by examiner

Primary Examiner—Tuan T. Lam
Assistant Examiner—Hiep Nguyen
(74) Attorney, Agent, or Firm—Laurence A. Greenberg; Werner H. Stemer; Ralph E. Locher

(57) ABSTRACT

An integrated semiconductor circuit having a first operating mode and a second operating mode has a plurality of input buffers. At least one of the input buffers serves for controlling a changeover between the operating modes. The input buffer for controlling the changeover between the operating modes has a driver circuit with an inverter circuit with low static leakage currents, which can be operated as intended in the first and second operating modes. The remaining input buffers each have a differential amplifier circuit, which is switched off in the second operating mode. A reduced minimum current consumption of the semiconductor circuit is achieved by virtue of the inverter circuit, which switches reliably even in the case of low supply voltages.

5 Claims, 1 Drawing Sheet

INPUT BUFFER OF AN INTEGRATED SEMICONDUCTOR CIRCUIT

BACKGROUND OF THE INVENTION

Field of the Invention

The present invention relates to input buffers of an integrated semiconductor circuit having different operating modes.

Integrated circuits have input buffers for connecting the integrated circuit to external input signals, for example. Frequently used driver circuits for input buffers are, for example, CMOS inverter circuits, which are principally distinguished by high switching speeds and low static leakage currents.

Particularly in the case of integrated circuits having a comparatively low supply voltage, simple CMOS inverter circuits can no longer be operated satisfactorily in their intended function. As a result of in some instances lower switching thresholds of the inverter circuit, there is in part the risk of the switching levels of the input signals being detected erroneously. The consequence of this may be erroneous switching operations. These may, in addition, be increasingly caused by interference signals, since the interference susceptibility of an inverter circuit increases with a lower supply voltage as a result of its lower switching levels.

In order to avoid the disadvantages mentioned above, driver circuits of input buffers have differential amplifiers, for example, in which the input signal is applied to one input and a variable reference potential for controlling the switching threshold is applied to the other input. However, a static current generally flows through a differential amplifier circuit and, for example when a plurality of input buffers with differential amplifiers are used, can lead to a considerable minimum current consumption of the integrated circuit.

In order to obtain a lower current consumption in a current-saving mode in comparison with a normal operating mode of the integrated circuit, differential amplifiers of input buffers that are not required in the current-saving mode are usually switched off. The input buffers or differential amplifiers whose input signals serve for controlling the changeover between the operating modes of the semiconductor circuit either remain in the active state, in order to ensure a fast changeover, or they are likewise switched off. This leads to a relatively long activation time of the relevant input buffer.

SUMMARY OF THE INVENTION

It is accordingly an object of the invention to provide an input buffer of an integrated semiconductor circuit, which overcomes the above-mentioned disadvantages of the prior art devices of this general type, which, in one of a plurality of operating modes of the semiconductor circuit, has an input buffer current consumption which is as low as possible, in conjunction with a comparatively small area requirement.

With the foregoing and other objects in view there is provided, in accordance with the invention, an integrated semiconductor circuit. The integrated semiconductor circuit includes a plurality of input buffers, each of the input buffers have a terminal for receiving an input signal. The input signal of at least one of the input buffers controls a changeover between operating modes, including a first operating mode and a second operating mode. The input buffer for controlling the changeover between the operating modes has a driver circuit with an inverter circuit operating as intended in the first operating mode and the second operating mode. Remaining other ones of the input buffers each have a differential amplifier circuit being switched off in the second operating mode.

The integrated semiconductor circuit contains a plurality of input buffers each having a terminal for an input signal. At least one of the input buffers serves for controlling the changeover between the first operating mode and the second operating mode of the semiconductor circuit, which input buffer has a driver circuit with an inverter circuit which can be operated as intended in the first and second operating modes. The remaining input buffers each have a differential amplifier circuit, which is switched off in the second operating mode. By way of example, the first operating mode is the normal operating mode of the semiconductor circuit, and the second operating mode is the current-saving mode of the semiconductor circuit, which has a lower minimum current consumption in comparison with the normal operating mode.

Since a driver circuit with an inverter circuit is used for controlling the changeover between the operating modes, a lower static minimum current consumption is achieved in comparison with the use of a differential amplifier circuit as is known in the prior art. In this case, the inverter circuit is configured in such a way that it has good and reliable switching behavior even in the case of applications having a comparatively low supply voltage in comparison with a differential amplifier circuit. The inverter circuit of the input buffer can thus be operated as intended in the first and second operating modes. The input buffers which are not required for the second operating mode, or their differential amplifiers, are switched off for the purpose of reducing the static minimum current consumption in the second operating mode.

The semiconductor circuit according to the invention is additionally distinguished by a comparatively small space requirement since the inverter circuit can be operated as intended in both operating modes and, consequently, no additional circuit is necessary, for instance for a differential amplifier circuit. The semiconductor circuit according to the invention can therefore advantageously be used principally in circuits that are provided for operating in mobile applications, such as mobile telephones or laptops, for example.

In one embodiment according to the invention, the inverter circuit has switching transistors and a hysteresis transistor, whose control terminal is connected to an output of the driver circuit and whose controlled path is connected in parallel with the controlled path of one of the switching transistors. The provision of the hysteresis transistor results in that the switching threshold of the inverter circuit is shifted toward higher switching thresholds, particularly in the case of a hitherto critical low-high transition of the input signal.

In an advantageous development, the driver circuit of the input buffer for controlling the changeover between the operating modes has a further inverter circuit connected downstream of the inverter circuit mentioned above. Disposing the further inverter circuit upstream of the control terminal of the hysteresis transistor achieves not only complete blocking of the hysteresis transistor but also a greater edge steepness of the drive signal for the control input of the hysteresis transistor, with the result that the latter has very short switching times.

In a further refinement of the inverter circuit according to the invention, the inverter circuit has at least two switching transistors of different conductivity types, which are dimensioned differently depending on the conductivity type. By way of example, when a CMOS inverter stage is used, the P-channel transistors are dimensioned to be stronger with regard to the current yield than the N-channel transistors. In this way, the reduced conductivity of the P-channel transistors in case of lower supply voltages is at least partly compensated for. In this connection, it is likewise possible, as an alternative or in addition to the different dimensioning of the switching transistors, to connect a large number of P-channel transistors in parallel, in order to increase the current yield of the P-channel transistors in this way.

Other features which are considered as characteristic for the invention are set forth in the appended claims.

Although the invention is illustrated and described herein as embodied in an input buffer of an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
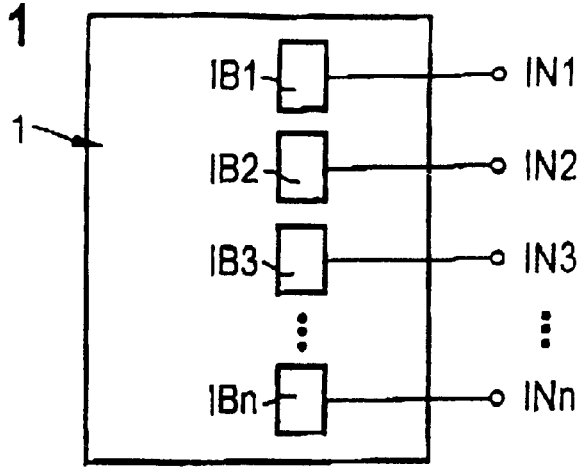
FIG. 1 is a diagrammatic illustration of an integrated semiconductor circuit having input buffers according to the invention.

In all the figures of the drawing, sub-features and integral parts that correspond to one another bear the same reference symbol in each case. Referring now to the figures of the drawing in detail and first, particularly, to FIG. 1 thereof, there is shown a schematic illustration of an integrated semiconductor circuit 1 having input buffers IB1 to IBn. The input buffers IB1 to IBn each have terminals for input signals IN1 to INn. The semiconductor circuit 1 has a first operating mode and a second operating mode, which are for example for a normal operating mode and current-saving operating mode (power-down), respectively, of the semiconductor circuit 1. In this case, the input buffer IB1, for example, is provided for controlling a changeover between the operating modes. The input signal IN1 of the input buffer IB1 controls whether the integrated semiconductor circuit 1 is in the first operating mode or in the second operating mode. Particularly in the case of integrated semiconductor memories, such as e.g. synchronous dynamic random access memories (DRAMs), two input signals are also used for this purpose. In the case of a corresponding activation signal, in the case of a next active clock signal the semiconductor memory is switched from the powered-down operating mode to the normal operating mode. The aim here is for the semiconductor memory to be made fully operational again as far as possible immediately after the switching edge of the active clock signal.

Figure 2:
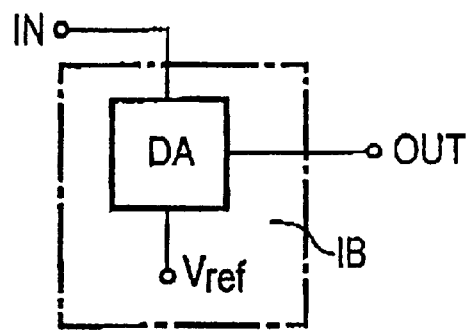
FIG. 2 is a block diagram of a driver circuit of an input buffer having a differential amplifier.

The remaining input buffers IB2 to IBn illustrated in FIG. 1 have differential amplifier circuits. A driver circuit of one of the input buffers IB2 to IBn having a differential amplifier DA is illustrated in FIG. 2. The input signals of the differential amplifier DA are the signals IN and the reference potential $V_{ref}$ for setting the switching threshold of the differential amplifier DA. An output signal of the input buffer IB is the signal OUT. In order to keep the static minimum current consumption of the input buffers as low as possible, the input buffers IB2 to IBn which are not required for operation in the second operating mode are switched off.

Figure 3:
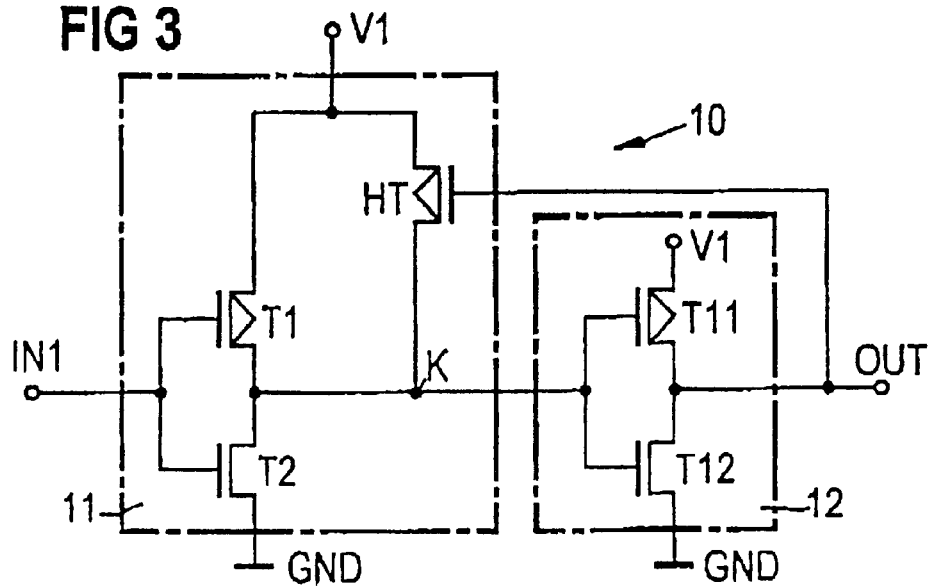
FIG. 3 is a circuit diagram of the driver circuit of the input buffer having an inverter circuit.

FIG. 3 shows an embodiment of a driver circuit 10 of the input buffer IB1 for controlling the changeover between the operating modes. The driver circuit 10 includes an inverter circuit 11 having the switching transistors T1 and T2, whose control terminals are connected to the input signal IN1. The transistors T1 and T2 are connected in series by their controlled paths, the transistor T1 is of a P-channel type and is connected to a positive supply voltage V1 and the transistor T2 is of an N-channel type and is connected to a reference-ground potential GND. Connected downstream of the inverter circuit 11 is an inverter circuit 12 with its switching transistors T11 and T12, which are connected up analogously to the inverter circuit 11. The inverter circuit 11 furthermore has a hysteresis transistor HT, whose control terminal is connected to the output of the driver circuit 10 having the output signal OUT, and whose controlled path is connected in parallel with the controlled path of the transistor T1.

If the hysteresis transistor HT is in the on state (signal IN1 in the low state, that is to say at reference-ground potential GND), then upon the next transition of the signal IN1 to the high state (supply potential V1) the switching threshold of the inverter circuit 11 is shifted toward higher potential values. The result of this is that, for example in the case of comparatively low supply voltages, relatively high interference voltages, which however still lie below the increased switching threshold, do not lead to erroneous switching operations of the driver circuit 10. A high-low transition is generally not influenced by a comparatively low supply voltage.

This effect can be supported by an asymmetrical dimensioning of the switching transistors T1 and T2. The P-channel transistor T1 is dimensioned to be stronger with regard to its current yield than the N-channel transistor T2. It is likewise possible to provide a plurality of P-channel transistors which are connected in parallel with the transistor T1 and increase the conductivity overall.

By virtue of a further inverter circuit 12, to whose output the control terminal of the hysteresis transistor HT is connected, the switching edges of the latter are accelerated. At a node K, a potential value at the level of the threshold voltage of the inverter circuit 12 already suffices to turn the hysteresis transistor HT completely on or off. This can contribute to increasing the switching speed of the driver circuit 10 overall.

I claim:

1. An integrated semiconductor circuit, comprising:
   a plurality of input buffers, each of said input buffers having a terminal for receiving an input signal, the input signal of at least one of said input buffers controls a changeover between operating modes, including a first operating mode and a second operating mode, said one of said input buffers for controlling the changeover between the operating modes having a driver circuit and an inverter circuit operating as intended in the first operating mode and the second operating mode, and remaining other ones of said input buffers each having a differential amplifier circuit being switched off in the second operating mode.

2. The integrated semiconductor circuit according to claim 1, wherein the first operating mode is a normal operating mode and the second operating mode is a current-saving operating mode of the integrated semiconductor circuit.

3. The integrated semiconductor circuit according to claim 1, wherein said driver circuit has an output, said inverter circuit has switching transistors and a hysteresis transistor with a control terminal connected to said output of said driver circuit, said switching transistors have a controlled path and said hysteresis transistor has a controlled path connected in parallel with said controlled path of one of said switching transistors.

4. The integrated semiconductor circuit according to claim 3, wherein said driver circuit has a further inverter circuit connected downstream of said inverter circuit.

5. The integrated semiconductor circuit according to claim 1, wherein said inverter circuit has at least two switching transistors of different conductivity types and dimensioned differently depending on a respective conductivity type.

* * * * *